United States Patent
Nara

(10) Patent No.: US 7,777,659 B2
(45) Date of Patent: Aug. 17, 2010

(54) ANALOG TO DIGITAL CONVERSION SYSTEM

(75) Inventor: Akira Nara, Tokyo (JP)

(73) Assignee: Tektronix, Inc., Beaverton, OR (US)

( * ) Notice: Subject to any disclaimer, the term of this patent is extended or adjusted under 35 U.S.C. 154(b) by 0 days.

(21) Appl. No.: 12/180,470

(22) Filed: Jul. 25, 2008

(65) Prior Publication Data

US 2009/0027250 A1    Jan. 29, 2009

(30) Foreign Application Priority Data

Jul. 27, 2007    (JP)    ............................... 2007-195646

(51) Int. Cl.
*H03M 1/12*    (2006.01)
(52) U.S. Cl. ..................... 341/155; 341/143
(58) Field of Classification Search ................. 341/155, 341/159, 144, 143
See application file for complete search history.

(56) References Cited

U.S. PATENT DOCUMENTS 6,031,869 A * 2/2000 Priebe et al. ................. 375/224
6,574,459 B1 * 6/2003 Kaminski et al. ............ 455/272
RE40,564 E * 11/2008 Fischer et al. ................ 455/561
7,542,812 B2 * 6/2009 Stroili et al. .................... 700/90

FOREIGN PATENT DOCUMENTS

WO    WO9732404 A1    9/1997

* cited by examiner

*Primary Examiner*—Peguy JeanPierre
(74) *Attorney, Agent, or Firm*—Michael A. Nelson

(57) ABSTRACT

While combining AD converters that one is wide band but narrow dynamic range and the other is narrow band but wide dynamic range, it allows settings to provide a common intermediate frequency signal to the AD converters. A first BPF 50 provides a first AD converter 54 with the output signal obtained by getting an intermediate frequency signal Sif through a first band in the second Nyquist zone of the first AD converter 54. A second BPF 52 provides a second AD converter 56 with the output signal obtained by getting the intermediate frequency signal Sif through a second band in the third Nyquist zone of the second AD converter 56. At this time, the second band is set in the center portion of the second Nyquist zone band, and the first band is set in the center portion of the band of the intermediate frequency signal.

8 Claims, 3 Drawing Sheets

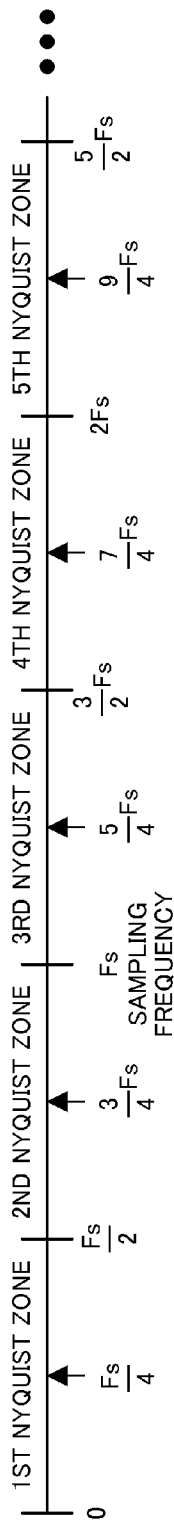
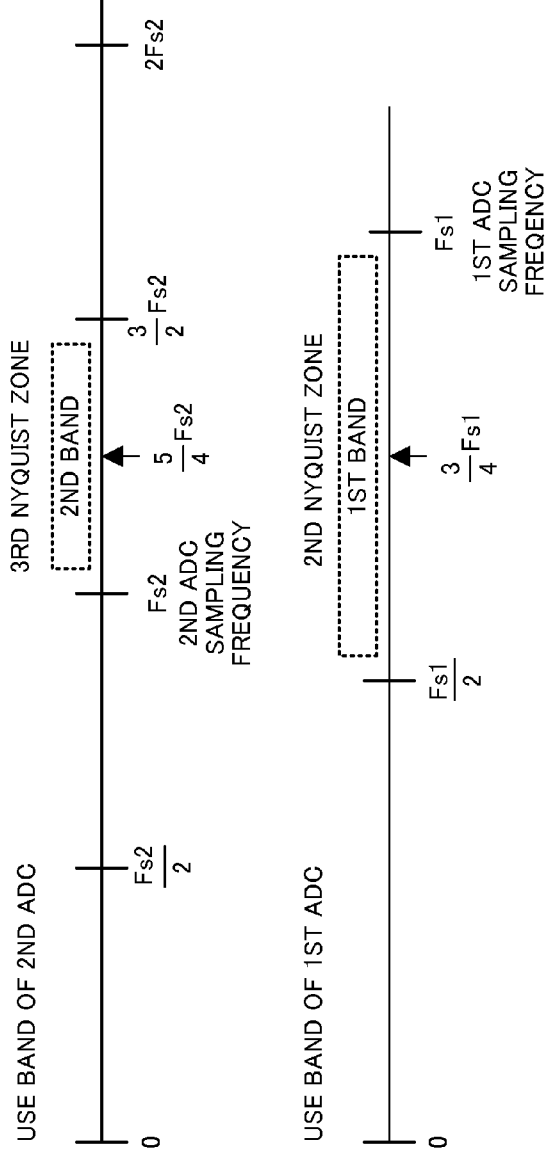
FIG. 3
FIG. 4

ANALOG TO DIGITAL CONVERSION SYSTEM

FIELD OF THE INVENTION

This invention relates to an analog to digital conversion system, especially, to the analog to digital conversion system that realizes a simplified frequency conversion circuit while satisfying wide dynamic range and wide band.

BACKGROUND

A signal analyzer is used for analyzing a signal of a wireless device such as a mobile phone from two viewpoints of time and frequency domains. The signal analyzer converts the analog signal under test into digital data that is digitally processed to produce frequency domain data for example using an FFT.

The signal analyzer is required to have a wider dynamic range and a wider band. The key is to satisfy both wide dynamic range and wide band in the analog to digital conversion.

It is, however, very difficult for an available analog to digital converter to satisfy both a wide dynamic range (=a large bit number) and a wide band (=a high sampling frequency) at the same time. For example, the LTC2242-12, 12-Bit analog to digital (AD) converter manufactured by Linear Technology Corporation, U.S.A., has a sampling frequency of 250 MHz. The LTC2208, 16-Bit AD converter manufactured by the said company has a sampling frequency of 130 MHz. As described, the larger the bit number is, the lower the sampling frequency is in general.

Accordingly, a conventional signal analyzer may have a plurality of analog to digital converters wherein one of them is optimized for a dynamic range and another is done for a bandwidth, or a high sampling frequency, and they are used in parallel. For example, Japanese patent 3,433,724 discloses such an invention.

FIG. 1 is a block diagram of an invention that the Japanese patent No. 3,433,724 discloses. The first path has a narrow band but a wide dynamic range, and the second path has a narrow dynamic range but a wide band.

SUMMARY

The described method using a plurality of analog to digital converters requires the respective frequency converters because the bands of the signals that should be provided to the respective circuits are different. In FIG. 1, first and second mixers 6 and 8 are provided to produce signals having bands suitable for the respective first and second paths. Increase of the number of frequency converters leads to circuit complexity and cost increase.

An analog to digital conversion system according to an embodiment of the present invention uses a combination of first and second analog to digital converting means of different sampling frequencies and bit numbers to produce digital data of a narrow dynamic range with a wide band, and digital data of narrow band with a wide dynamic range, but uses a common frequency conversion means to provide an intermediate frequency signal derived from an input signal to them. Wherein the sampling frequency of the first analog to digital converting means is Fs1 and the sampling frequency of the second analog to digital converting means is Fs2 that is lower than Fs1. A first filter means provides the first analog to digital converting means with the output signal obtained by getting the intermediate frequency signal through a first band in the nth Nyquist zone of the first analog to digital converting means. A second filter means provides the second analog to digital converting means with the output signal obtained by getting the intermediate frequency signal through a second band in the kth Nyquist zone of the second analog to digital converting means. Wherein n and k are the order numbers of the Nyquist zones.

In embodiments of the present invention, the kth Nyquist zone band is set within the nth Nyquist zone band and the nth Nyquist zone band is set within the band of the intermediate frequency signal. More preferably, the kth Nyquist zone band is set in the center portion of the nth Nyquist zone band and the nth Nyquist zone band is set in the center portion of the band of the intermediate frequency signal. Specifically, the order numbers n and k of the nth and kth Nyquist zones are integers and n, k, Fs1 and Fs2 satisfying an equation of $(2n-1)Fs1=(2k-1)Fs2$ are selected and used to align the center frequencies of the nth and kth Nyquist zones so that the values may be referred as references and adjusted values may be used. In other words, the values roughly satisfying (and/or completely satisfying) the equation $(2n-1)Fs1=(2k-1)Fs2$ may be selected and used.

Further, the center frequencies of the first and second bands may be substantially and/or completely aligned. This allows the first and second analog to digital converting means to use the center portion of the intermediate frequency signal, which leads to the best characteristics. For convenience of circuit design, it is preferable that the order number n of the nth Nyquist zone should be an integer of two or more. Then, the order number k of the kth Nyquist zone of the second converting means may be an integer of three or more that is larger than n because the sampling frequency Fs2 is lower than that of the first converting means.

As described, embodiments of the present invention combine the analog to digital converters such that one has a high sampling frequency (wide band) but a small bit number (narrow dynamic range) and another has a low sampling frequency (narrow band) but a large bit number (wide dynamic range) while a common frequency conversion means that provides the intermediate frequency signal to them can be used. Therefore, it has both excellent dynamic range and wide band while simplifying the RF circuits to reduce the cost. The system can be easily re-configured depending on a purpose by modifying the combination of the analog to digital converters.

BRIEF DESCRIPTION OF THE DRAWINGS

FIG. 3 is a chart for explaining order numbers of Nyquist zones.

FIG. 4 shows a relationship between the first and second bands and the Nyquist zones used in the first and second AD converters 54 and 56.

DETAILED DESCRIPTION

Figure 1:
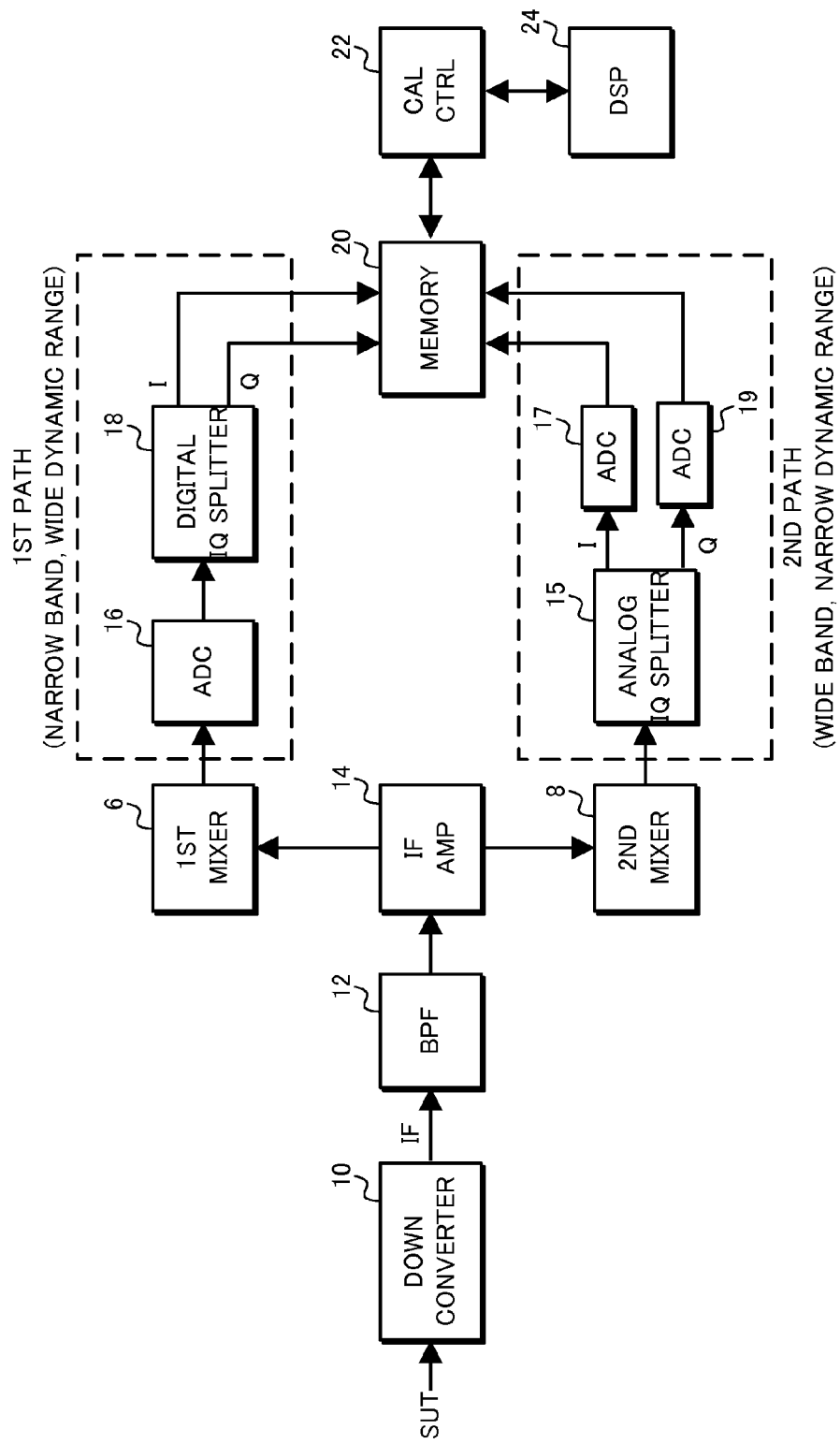
FIG. 1 (Priori Art) is a block diagram of a conventional signal analyzer including analog to digital converters.
Figure 2:
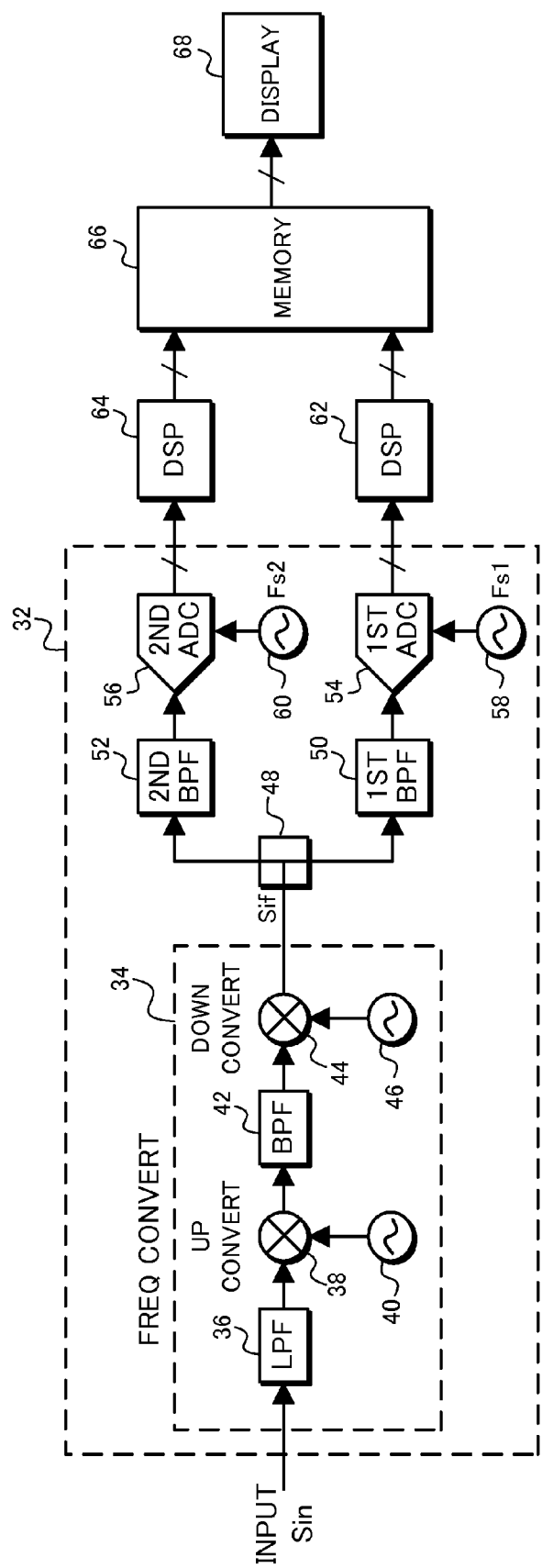
FIG. 2 is a block diagram of a signal analyzer including analog to digital conversion system according to an embodiment of the present invention.

FIG. 2 is a block diagram of a signal analyzer 30 including an analog to digital conversion system 32 according to an embodiment the present invention. It has CPU, hard disk drive, mouse, etc. as they are not shown but well known in a PC. A user may set up necessary settings such as center frequency and frequency span of a band in an input signal Sin that the user wants to measure through the operation panel (not shown).

A frequency conversion stage 34 receives the input signal Sin and produces an intermediate frequency (IF) signal Sif having a suitable band according to a user-set band defined by center frequency and frequency span of a user desired band in the input signal Sin, and the bands used in the AD converters described below. In FIG. 2, mixer 38 and local oscillator 40 once up-convert the frequency to a higher frequency to seamlessly obtain an arbitrary band from DC to a high frequency. A lowpass filter 36 cuts an unnecessary high frequency component so as to avoid producing unnecessary components in the up-conversion. A bandpass filter (BPF) 42 extracts a necessary band. Mixer 44 and local oscillator 46 down-converts the extracted band to a lower frequency depending on characteristics of analog to digital converters 54 and 56.

A splitter 48 receives the IF signal Sif and distributes it to first and second BPFs 50 and 52.

The first and second BPFs 50 and 52 extract bands suitable for characteristics of the respective first and second analog to digital (AD) converters 54 and 56 from the input signal Sif, and provide them to the first and second AD converters 54 and 56. Specifically, they respectively filter the input signal Sif as is within one half (Nyquist frequency) of the bandwidth of each sampling frequency of the first and second AD converters 54 and 56.

Order numbers of Nyquist zones that the first and second AD converters 54 and 56 use are set to optimize dynamic range and bandwidth by combination of them. In the following description, let the sampling frequency of the first AD converter 54 be Fs1 and the sampling frequency of the second AD converter 56 be Fs2 that is lower than Fs1.

Digital signal processors (DSPs) 62 and 64 respectively process the digital data from the corresponding AD converters 54 and 56 to provide them to a memory 66. The memory 66 stores and provides the data to a display device 68 as necessary.

FIG. 3 is a chart of explaining the order numbers of the Nyquist zones. Let the sampling frequency of an AD converter be Fs and then the Nyquist zones are defined every Fs/2. The order number of the first Nyquist zone is 1, that of the second Nyquist zone is 2 and the like.

If the Nyquist zone of which order number is two or more is used, the produced digital data is an alias because the frequency is over the Nyquist frequency Fs/2. But if the frequency band of an input signal of the AD converter is made to fall within the same Nyquist zone with the corresponding filter, relationship between the input signal and the frequency of the produced digital data is described by a simple equation. For example, if the third Nyquist zone is used, the frequency of the produced digital data appears as a frequency-converted alias according an equation "Input signal frequency—Sampling frequency Fs". Therefore, even if the digital data directly produced by the AD converter is an alias the DSP can produce the digital data that represents a correct frequency of the input signal of the AD converter.

A signal analyzer generally uses the second Nyquist zone. If the first Nyquist zone is used a DC amplification circuit is required because it includes DC. But the second Nyquist zone allows processing through the band with AC circuits and a better analog to digital conversion IC is easily available relative to the third or higher Nyquist zone.

However, some of analog to digital conversion ICs of which sampling frequencies are relatively low have good performance even in the third or higher Nyquist zone. For example, the said LTC2208 16 bit 130 Msps AD conversion IC by Linear Technology Corporation has a lower sampling frequency than the LTC2242-12 12 bit 250 Msps AD conversion IC by the said company. However, the LTC2208 has a SFDR (Spurious Free Dynamic Range) that is 83 dB at 250 MHz, which means it has good characteristics up to about two times of the sampling frequency 130 MHz, or around the upper limit of the fourth Nyquist zone.

FIG. 4 shows relationship between first and second bands and Nyquist zones that the first and second AD converters 54 and 56 use. In this embodiment, the first BPF 50 provides the first AD converter 54 with the signal by getting the intermediate frequency signal Sif through a using band (called "first band" hereinafter) within the second Nyquist zone. The second BPF 52 provides the second AD converter 56 with the signal by getting the intermediate frequency signal Sif through a using band (called "second band" hereinafter) within the third Nyquist zone.

From a viewpoint of using the common intermediate frequency signal Sif, the second band can be in any positions within the first band. However, a central portion in the band of the intermediate frequency signal Sif shows the best characteristics because the frequency conversion stage 34 also uses filters. With this in mind, it is preferable to align the center frequencies of the first and second bands for obtaining better characteristics. Then, it is preferable to select the sampling frequencies and the Nyquist zone order numbers to align the centers of the Nyquist zones including the first and second bands.

In the embodiment of FIG. 4, the center frequencies of the second Nyquist zone of the first AD converter 54 including the first band and the third Nyquist zone of the second AD converter 56 including the second band are $3/4 Fs1$ and $5/4 Fs2$ respectively. Therefore the sampling frequencies Fs1 and Fs2 may be selected as satisfying an equation $3/4\ Fs1 = 5/4\ Fs2$.

In general, if the order numbers of the Nyquist zones that the first and second AD converters 54 and 56 use are n and k (n and k are integers), the center frequencies are described as $(2n-1)Fs1/4$ and $(2k-1)Fs2/4$ respectively. Then, the sampling frequencies Fs1 and Fs2 and Nyquist zone order numbers n and k may be selected as satisfying an equation $(2n-1)Fs1 = (2k-1)Fs2$. Note that this condition is for obtaining the best characteristics as described so that the values selected using the equation may be referred as references and adjusted values may be used. That is, the values roughly satisfying the equation $(2n-1)Fs1 = (2k-1)Fs2$ can be used.

For convenience of circuit design, it is preferable that the order number n of the nth Nyquist zone should be an integer of two or more as described. Then, the order number k of the kth Nyquist zone of the second AD converter 56 may be an integer of three or more that is larger than n because the sampling frequency Fs2 is lower than that of the first AD converter 54.

As described, embodiments of the present invention combines analog to digital converters such that one is high sampling frequency (wide band) but small bit number (narrow dynamic range) and another is low sampling frequency (narrow band) but large bit number (wide dynamic range) while it provides a common intermediate frequency signal to them. Therefore, it has both excellent dynamic range and wide band while simplifying the RF circuits to reduce the cost. The system can be easily re-configured depending on a purpose by modifying the combination of the analog to digital converters. The above embodiments show an example having two analog to digital converters but a system having three or more converters can be realized similarly.

What is claimed is:
1. An analog to digital conversion system comprising:
a frequency converter receiving an input signal and providing an intermediate frequency signal;

a first analog to digital converter with a sampling frequency Fs1;

a second analog to digital converter with a sampling frequency Fs2 that is lower than Fs1;

a first filter providing the first analog to digital converter with an output signal obtained by filtering the intermediate frequency signal through a first band in the nth Nyquist zone of the first analog to digital converter; and a second filter providing the second analog to digital converter with an output signal obtained by filtering the intermediate frequency signal through a second band in the kth Nyquist zone of the second analog to digital converter wherein the kth Nyquist zone band is set within the nth Nyquist zone band and the nth Nyquist zone band is set within the band of the intermediate frequency signal.

2. The analog to digital conversion system as recited in claim 1 wherein the order numbers n and k of the nth and kth Nyquist zones are integers and substantially satisfy an equation of $(2n-1)Fs1=(2k-1)Fs2$.

3. The analog to digital conversion system as recited in claim 2 wherein the center frequencies of the first and second bands are substantially the same.

4. The analog to digital conversion system as recited in claim 3 wherein the order number n of the nth Nyquist zone is an integer of two or more and the order number k of the kth Nyquist zone is an integer larger than n.

5. The analog to digital conversion system as recited in claim 2 wherein the order number n of the nth Nyquist zone is an integer of two or more and the order number k of the kth Nyquist zone is an integer larger than n.

6. The analog to digital conversion system as recited in claim 1 wherein the center frequencies of the first and second bands are substantially the same.

7. The analog to digital conversion system as recited in claim 6 wherein the order number n of the nth Nyquist zone is an integer of two or more and the order number k of the kth Nyquist zone is an integer larger than n.

8. The analog to digital conversion system as recited in claim 1 wherein the order number n of the nth Nyquist zone is an integer of two or more and the order number k of the kth Nyquist zone is an integer larger than n.

* * * * *